United States Patent
Witschey et al.

(10) Patent No.: US 8,148,982 B2
(45) Date of Patent: Apr. 3, 2012

(54) SPIN LOCKED BALANCED STEADY-STATE FREE PRECESSION (SLSSFP) WITH OFF-RESONANCE SPIN LOCKED PULSES INTERLEAVED WITH IMAGING GRADIENTS

(75) Inventors: Walter R. T. Witschey, Philadelphia, PA (US); Mark A. Elliott, Bryn Mawr, PA (US); Ari Borthakur, Philadelphia, PA (US); Ravinder Reddy, Gladwyne, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 350 days.

(21) Appl. No.: 12/426,703

(22) Filed: Apr. 20, 2009

(65) Prior Publication Data

US 2010/0264920 A1    Oct. 21, 2010

(51) Int. Cl.
G01V 3/00 (2006.01)
(52) U.S. Cl. .......... 324/309; 324/307; 324/318
(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| 6,208,136 B1 * | 3/2001 | Smith et al. | ................... | 324/300 |
| 7,345,478 B2 * | 3/2008 | Lieblich et al. | ............... | 324/300 |
| 7,659,124 B2 * | 2/2010 | Pusiol | ........................... | 436/173 |
| 7,787,930 B2 * | 8/2010 | Nezafat et al. | ................ | 600/410 |
| 7,920,972 B2 * | 4/2011 | Szyperski et al. | ............... | 702/27 |
| 8,076,936 B2 * | 12/2011 | Borthakur et al. | ............ | 324/307 |
| 2005/0202570 A1 * | 9/2005 | Pusiol | .......................... | 436/173 |
| 2006/0111846 A1 * | 5/2006 | Szyperski et al. | ............... | 702/19 |
| 2006/0253015 A1 * | 11/2006 | Nezafat et al. | ................ | 600/410 |
| 2008/0018332 A1 * | 1/2008 | Lieblich et al. | ............... | 324/300 |
| 2009/0273343 A1 * | 11/2009 | Borthakur et al. | ............ | 324/307 |
| 2009/0322331 A1 * | 12/2009 | Buracas | ........................ | 324/309 |
| 2010/0264920 A1 * | 10/2010 | Witschey et al. | ............. | 324/309 |

OTHER PUBLICATIONS

Borthakur, et al., "Three-dimensional T1 rho-weighted MRI at 1.5 Tesla," J. Magn. Reson. Imag. 2003, 17(6): 730-736.
Scheffler et al. in "T-1 Quantification with inversion recovery TrueFISP," Magn. Reson. Med. 2001, 45(4): 720-723.
Moran et al., "Near-Resonance Spin-Lock Contrast," Magn. Reson. Imag., 1995; 13(6): 837-846.
Ulmer et al., "Magnetization transfer or spin-lock? An investigation of off-resonance saturation pulse imaging with varying frequency offsets," Am. J. Neuroradiol., 1996; 17(5): 805-819.
Grohn et al., "On- and off-resonance T-1 rho MRI in acute cerebral ischemia of the rat," Magn. Reson. Med. 2003; 49 (1):172-176.

* cited by examiner

*Primary Examiner* — Brij B Shrivastav
*Assistant Examiner* — Tiffany Fetzner
(74) *Attorney, Agent, or Firm* — Woodcock Washburn, LLP

(57) ABSTRACT

A spin locked balanced steady-state free precession (slSSFP) pulse sequence combines a balanced gradient echo acquisition with an off-resonance spin lock pulse for fast MRI. The transient and steady-state magnetization trajectory is solved numerically using the Bloch equations and is shown to be similar to balanced steady-state free precession (bSSFP) for a range of T2/T1 and flip angles, although the slSSFP steady-state could be maintained with considerably lower RF power. In both simulations and brain scans performed at 7T, slSSFP is shown to exhibit similar contrast and SNR efficiency to bSSFP, but with significantly lower power.

22 Claims, 11 Drawing Sheets

SPIN LOCKED BALANCED STEADY-STATE FREE PRECESSION (SLSSFP) WITH OFF-RESONANCE SPIN LOCKED PULSES INTERLEAVED WITH IMAGING GRADIENTS

GOVERNMENT INTEREST

The present invention was supported in part by the National Institutes of Health (NIH), through grant P41 RR002305. The government may have certain rights in the invention.

TECHNICAL FIELD

The invention relates to a radiofrequency pulse sequence used to obtain images using a magnetic resonance imaging device and, more particularly, to a spin locked balanced steady-state free precession pulse sequence (slSSFP). slSSFP delivers radiofrequency pulses that are parallel to the magnetization and off-resonance.

BACKGROUND OF THE INVENTION

It is well known that in the presence of radiofrequency (RF) irradiation, spin magnetization has different relaxation properties from T1 and T2. In the rotating reference frame, the components of the magnetization parallel and perpendicular to the effective field have characteristic relaxation times $T1\rho$ and $T2\rho$, respectively. Like T1, $T1\rho$ varies, or disperses, with field strength because of energy exchange with the lattice. In MR imaging, $T1\rho$ contrast is useful because only frequency components of the lattice that are equivalent to the amplitude of the RF field can cause relaxation in the rotating frame. These frequency components are typical of slow exchange, such as proton water exchange with hydroxyl and amide functional groups, slow rotation, static dipolar or quadrupolar interactions.

There are a great number of $T1\rho$ pulse sequences for imaging that all require both magnetization preparation to sensitize the signal to relaxation and long delay times to restore equilibrium. This paradigm is inherently time inefficient. Instead, it might be desirable to continuously acquire the $T1\rho$-weighted signal in the steady-state. Certainly, a few $T1\rho$ sequences employ very short delay times, and, therefore, a steady-state is formed (see Borthakur, et al., "Three-dimensional T1 rho-weighted MRI at 1.5 Tesla," J. Magn. Reson. Imag. 2003, 17(6): 730-736). This technique is rarely used in practice because of the significant signal loss incurred when equilibrium is not fully restored and, because of specific absorption rate (SAR) constraints, the minimum scan time is usually much greater than a magnetization prepared multi-acquisition scheme that allows full recovery of longitudinal magnetization.

Steady-states in MRI are ubiquitous. Likely the most well known steady-state contrast is the short TR, low flip angle, spoiled gradient echo, which produces T1 contrast. Equally well known is the short TR balanced steady-state free precession (bSSFP) sequence, which produces a T2/T1 contrast. Unfortunately, it is not clear how to establish a steady-state $T1\rho$ contrast with significant signal, since, on-resonance, the rotating frame thermal polarization is nearly zero with RF fields appropriate for clinical use. On the other hand, the steady-state of an off-resonance spin lock can be significant, but the problem remains to deliver an off-resonance spin locking RF pulse train interrupted briefly for a short period of data acquisition.

SUMMARY OF THE INVENTION

The MR imaging sequence of the invention improves contrast and signal to noise ratio while simultaneously reducing image acquisition time and the specific absorption rate of radiation (SAR) delivered to tissues. In particular, a spin locked steady state free precession pulse sequence (slSSFP) has been developed that has a contrast similar to bSSFP, but with significantly lower power requirements. When compared to the well known bSSFP signal, the slSSFP signal of the invention was found to be nearly identical at half the flip angle, demonstrating high SNR efficiency with significantly lower power than bSSFP (e.g., ¼ the power required for a conventional bSSFP sequence).

In an exemplary embodiment, a device is provided that generates an MR imaging sequence including an RF field delivered off-resonance and with a phase parallel to the magnetization. The MR imaging sequence includes a plurality of pulse sequences, each sequence of duration TR including a single, nonselective, off-resonance spin locking pulse or adiabatic pulse of amplitude $\omega_1$ and non-instantaneous duration TSL is delivered parallel to the magnetization. The spin locking or adiabatic pulse is followed by a short period for frequency and phase encoding. The phase of the transmitter and receiver are incremented by $\Delta\omega t$ (e.g., $\pi/4$, where $\Delta\omega$ is the amount the phase of the off resonance pulses differ from the Larmor precession frequency and t is the duration of the period between each spin locking pulse) following each spin locking or adiabatic pulse such that the magnetization rotates with the RF field during the application of the MR imaging sequence so as to trace a cone of fixed angle with respect to the z-axis. The image acquisition is also interleaved with adiabatic pulses. The resultant steady state signal is not dependent (over a range of RF power used in imaging) on the power or flip angle of the spin locking or adiabatic pulses. Moreover, since the frequency is changed but not the amplitude of the RF pulse, the pulse power is not changed and is significantly reduced compared to bSSFP pulse power for comparable contrast. The low power requirements are particularly advantageous for high power (3 Tesla or more) imaging systems, as the SAR is reduced.

The resulting MR imaging method of the invention includes a method for creating a magnetic resonance image of a sample, comprising applying a magnetic field to the sample to be imaged, generating, using a computer, a pulse sequence comprising a series of off-resonance spin locked pulses and/or adiabatic pulses of finite duration that are applied at a phase in parallel to the applied magnetic field and imaging gradients interleaved with the slSSFP pulses in the series, generating from the pulse sequence radiofrequency fields that perturb the magnetic field about the sample, and acquiring a magnetic resonance image of the sample from the imaging gradients. In exemplary embodiments, the spin locked pulses may be applied in a transient period of the magnetic field or may be spin locked steady state free precession pulses (slSSFP). The method may also include incrementing the phase of a pulse transmitter that generates the radiofrequency fields and an image acquisition device that acquires the magnetic resonance image between slSSFP pulses by $\Delta\omega t$, where $\Delta\omega$ is an amount the phase of the off resonance slSSFP pulses differ from the Larmor precession frequency and t is the duration of the period between each slSSFP pulse. If operating in a frame of reference at the Larmor frequency, the method may further include rotating the magnetic field at a constant frequency $\Delta\omega$ around a z-axis during irradiation of the sample by the radiofrequency fields, rather than during a free precession period. The method may also include applying an initial preparatory pulse having a flip angle α=0 around the z-axis and an amplitude $\omega_1$ that is much greater than 1/T1 and 1/T2 whereby the magnetic field remains fixed and does not rotate. The method may further include creating a steady state magnetic field depending upon at least T1, T2, and Δω, wherein the pulse sequence is not dependent over a range of radiofrequency power used in imaging the sample on the power or flip angle of the slSSFP pulses or adiabatic pulses.

The scope of the invention also includes a computer readable storage medium that contains code stored thereon that then read by a processor of the system causes the processor to implement the imaging method of the invention.

BRIEF DESCRIPTION OF THE DRAWINGS

The various novel aspects of the invention will be apparent from the following detailed description of the invention taken in conjunction with the accompanying drawings, of which:

FIG. 10 illustrates a single slice from two consecutive acquisitions of bSSFP and slSSFP in which both the band separation and signal amplitude is similar.

DETAILED DESCRIPTION OF ILLUSTRATIVE EMBODIMENTS

The invention will be described in detail below with reference to FIGS. 1-11. Those skilled in the art will appreciate that the description given herein with respect to those figures is for exemplary purposes only and is not intended in any way to limit the scope of the invention. All questions regarding the scope of the invention may be resolved by referring to the appended claims.

Figure 1:
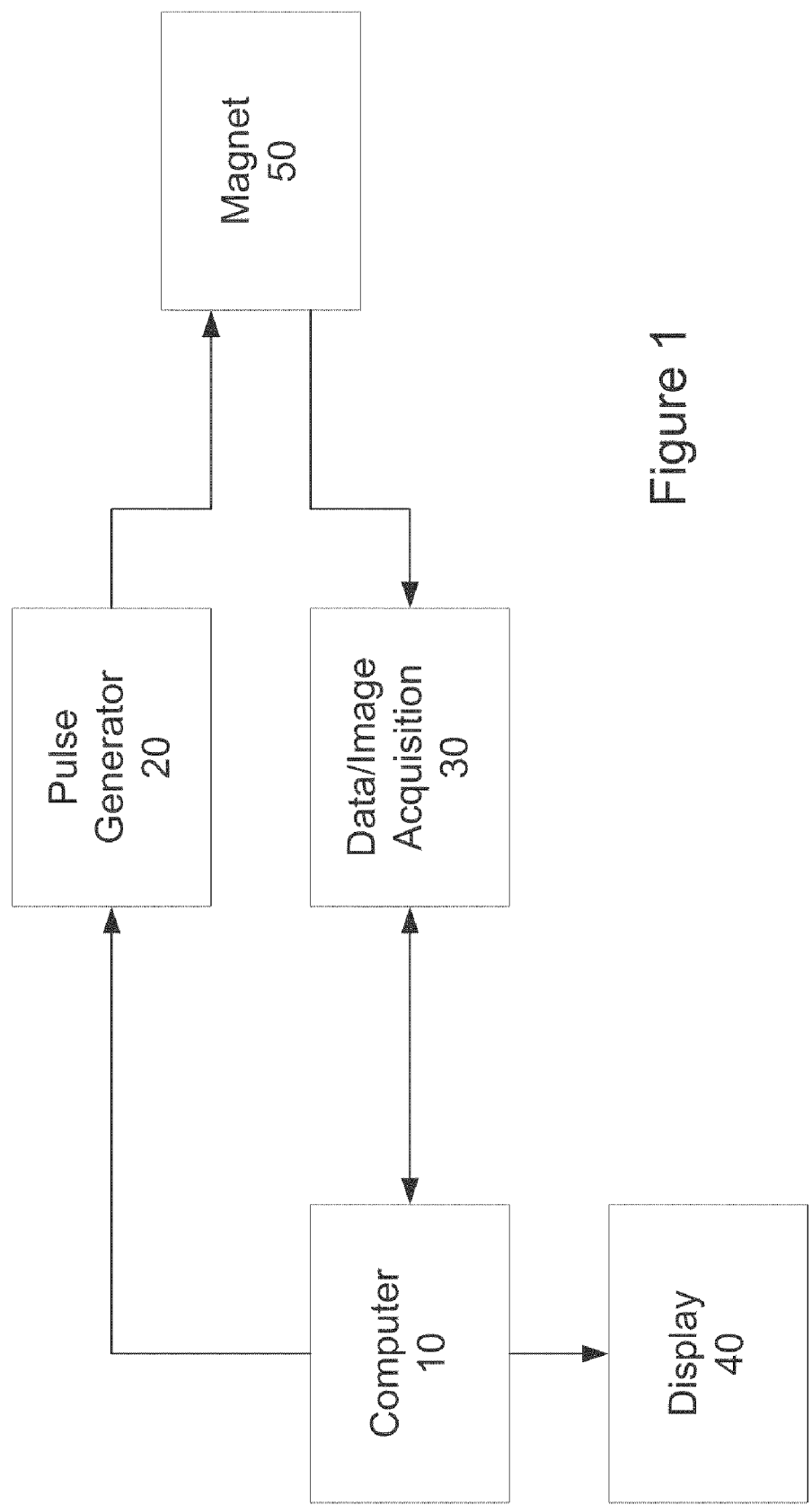
FIG. 1 is a block diagram of a magnetic resonance imaging system that may be programmed to generate pulse sequences in accordance with the invention.

FIG. 1 is a block diagram of a magnetic resonance imaging (MRI) system that may be programmed to generate pulse sequences in accordance with the invention. As illustrated in block form, the main components of an MRI system are a computer 10, an RF pulse generator 20, a data acquisition element 30 including gradient coils (not shown), a display 40 and a magnet 50. A person skilled in the art will recognize that the different elements are well known in the art and thus require no explanation as to their construction. The computer 10 in the system of FIG. 1 in accordance with the invention is programmed, or can be programmed, to carry out the described RF pulse generating methods described herein.

Those skilled in the art will appreciate that the computer 10 of FIG. 1 may be implemented as any suitable computing environment including a processor programmed to execute software routines adapted to control the pulse generator 20 to generate radiofrequency (RF) pulses as described herein as well as to control data acquisition through control of the timing of data acquisition and the associated generation of imaging gradients by data acquisition device 30. Those skilled in the art will appreciate that the invention includes a machine or computer programmed by computer-executable instructions, such as program modules, so as to implement the methods described herein. The computer may be a client workstation, a server, a personal computer, or the like. Generally, the program modules include routines, programs, objects, components, data structures and the like that perform particular tasks or implement particular abstract data types. Moreover, it should be appreciated that the invention and/or portions thereof may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

Those skilled in the art will further appreciate that the computer 10 may further include a device (not shown) for reading computer readable storage media such as a hard disk, a removable magnetic disk, and/or a removable optical disk such as a CD-ROM or other optical media. Such devices (e.g., hard disk drive) and their associated computer-readable storage media provide non-volatile storage of computer readable instructions, data structures, program modules and other data for the computer. It will be further appreciated by those skilled in the art that other types of computer readable media that can store data that is accessible by a computer may also be used to store software code for implementing the methods of the invention in the exemplary operating environment. Such other types of media include a magnetic cassette, a flash memory card, a digital video disk, a Bernoulli cartridge, a random access memory (RAM), a read-only memory (ROM), and the like. The invention includes such computer readable storage media having instruction stored thereon that, when executed by a processor, cause the processor to implement the techniques of the invention as described below.

Pulse Sequence Design

Figure 2A:
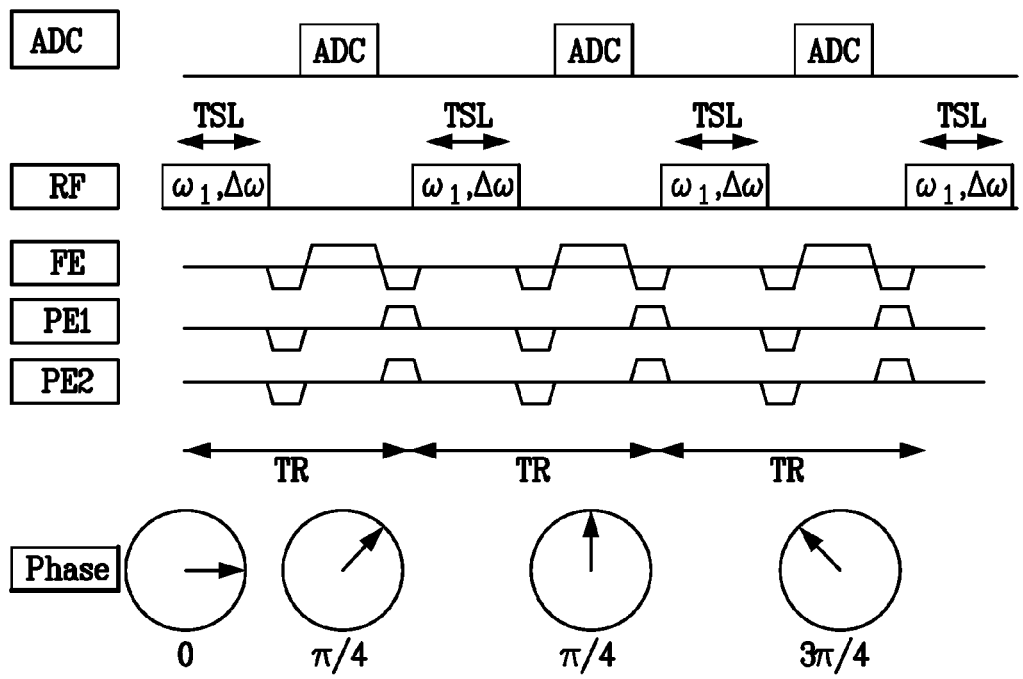
FIG. 2 illustrates the slSSFP pulse sequence of the invention.
Figure 2B:
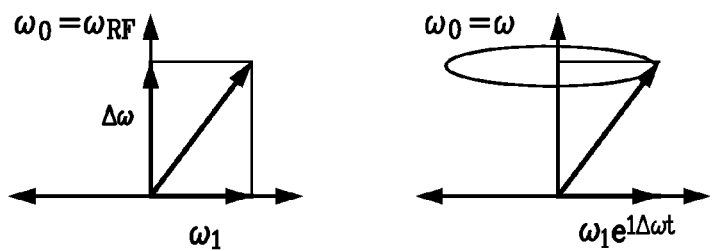

The slSSFP imaging sequence of the invention is shown in FIG. 2. In FIG. 2A, three kernels of the slSSFP pulse sequence are shown diagrammatically. During each repetition of the kernel (duration=TR), a single nonselective, off-resonance spin locking pulse of amplitude $\omega_1$ and non-instantaneous duration TSL is delivered parallel to the magnetization, followed by a short period for frequency and phase encoding. In this example, the phase of the transmitter and receiver are incremented by ΔωTSL=π/4 following each locking pulse. In FIG. 2B, the magnetization trajectory in a reference frame is shown rotating with the RF field (left) and with the Larmor frequency (right). In the frame rotating with the RF field, the magnetization is fixed along a single axis, but in a frame rotating at the Larmor frequency, the magnetization rotates with the RF field tracing a cone of fixed angle with respect to the z-axis.

In an exemplary embodiment of the method of the invention, the initial magnetization is partially flipped into the transverse plane by a preparatory RF pulse (not shown). Thereafter, a train of off-resonance spin locking pulses is applied continuously to the magnetization. FIG. 2A depicts 3 such kernels, where each kernel of duration TR comprises a spin locking pulse of duration TSL interleaved with a period for frequency encoding (FE) and phase encoding (PE1 and PE2). The off-resonance spin locking pulses are characterized by an amplitude $\omega_1$ and frequency $\omega_{RF}$, which may differ from the Larmor precession frequency $\omega$ by $$\Delta\omega = \omega - \omega_{RF} \qquad [1]$$

In a reference frame $\omega_0$ which rotates at the frequency of the RF field $$\omega_0 = \omega_{RF} \qquad [2]$$

the magnetization nutates about an effective field with amplitude $$\omega_{eff} = \sqrt{\Delta\omega + \omega_1} \qquad [3]$$

The effective field makes an angle with the z-axis such that $$\tan\frac{\alpha}{2} = \frac{\omega_1}{\Delta\omega} \qquad [4]$$

As will be explained below, this angle is $\alpha/2$, rather than $\alpha$. Each off-resonance spin locking pulse is terminated momentarily to apply frequency and phase encoding imaging gradients, and for data acquisition, after which the spin lock is resumed. In this way, the entire train of off-resonance spin locking pulses is alternated with data acquisition periods until all repetitions of the kernel are complete.

If the flip angle of the initial preparatory pulse is chosen such that its flip angle $\alpha=0\alpha=0$, the interpulse interval required for gradient dephasing, acquisition and rewinding is short (TR<<T1, T2), and the spin lock amplitude is sufficient $$\omega_1 \gg \frac{1}{T1}, \frac{1}{T2} \qquad [5]$$

then the magnetization remains fixed along the effective field and does not rotate (FIG. 2B). During the interpulse interval, the magnetization precesses around the z-axis with frequency $\Delta\omega$, as usual, and the phase of the subsequent RF pulse is incremented by $$\varphi = \Delta\omega t \qquad [6]$$

where t is the duration of the period between two locking pulses. Alternatively, in a reference frame that rotates at the Larmor precession frequency $$\omega_0 = \omega \qquad [7]$$

the magnetization rotates at a constant frequency $\Delta\omega$ around the z-axis during RF irradiation, rather than during the free precession period.

A key feature of the sequence of FIG. 2 is that the resultant contrast is fundamentally different from an off-resonance T1ρ prepared experiment, since the magnetization is in a complicated steady-state, which depends on $\omega_1$, $\Delta\omega$, T1ρ, T1, and T2 and, unexpectedly, seems much closer in contrast to a half-alpha prepared, phase alternated, balanced steady-state free precession (bSSFP) sequence.

Numerical Simulations

The transient and steady-state response of the magnetization to the slSSFP pulse sequence of FIG. 2 and conventional bSSFP pulse sequences was simulated in Matlab (Version 7.5.0, Natick, Mass.) using an ordinary differential equation solver based on an explicit Runge-Kutta (4,5) formula, the Dormand-Prince pair. The Bloch equations were formulated to include the effects of RF irradiation and relaxation in a frame of reference rotating at the Larmor precession frequency:

$$\frac{dM_x}{dt} = M_z\omega_1\cos(\Delta\omega t) - \frac{M_x}{T2} \qquad [8]$$
$$\frac{dM_y}{dt} = M_z\omega_1\sin(\Delta\omega t) - \frac{M_y}{T2}$$
$$\frac{dM_z}{dt} = -M_y\omega_1\sin(\Delta\omega t) - M_x\omega_1\cos(\Delta\omega t) - \frac{1-M_z}{T1}$$

The complex signal was the transverse components of the magnetization:

$$S(t) = M_x + iM_y \qquad [9]$$

In the simulation of the slSSFP pulse sequence, a single, 35°, preparatory RF pulse was delivered on-resonance to flip the magnetization along the effective field. Subsequently, a series of rectangular off-resonance spin locking pulses were delivered each with amplitude $$\frac{\omega_1}{2\pi} = \frac{\alpha}{4\pi TSL} = 97.22 \text{ Hz} \qquad [10]$$

and frequency $$\frac{\Delta\omega}{2\pi} = \frac{\omega_1}{2\pi\tan\alpha/2} = 138.85 \text{ Hz} \qquad [11]$$

such that the effective field $$\frac{\omega_{eff}}{2\pi} = \frac{\sqrt{\omega_1^2 + \Delta\omega^2}}{2\pi} = 169.50 \text{ Hz} \qquad [12]$$

For all simulations, each spin locking pulse (TSL=1 ms) was interleaved with a period of free precession (=4 ms) and each subsequent RF pulse phase was shifted $\Delta\omega$TSL, so that the magnetization was always locked along the effective field. The total number of pulses was 600 and the simulated scan duration was 3 s. The relaxation times T1 (=1000 ms) and T2 (=45 ms) were chosen to correspond roughly to those of knee articular cartilage.

The slSSFP signal response is compared to the well-known bSSFP signal response because bSSFP has very high signal-to-noise (SNR) efficiency and, like slSSFP, has balanced gradients and fixes the magnetization along a well defined axis in the steady-state. bSSFP was constructed by half-alpha preparation and 180° phase alternation of the RF pulse every TR. The bSSFP RF pulse flip angle $\alpha$ (=70°) was chosen to be twice the amplitude of the slSSFP initial pulse flip angle so that the steady-state magnetization had the same alignment as slSSFP with respect to the transverse plane. The duration of the bSSFP RF pulse (=1 ms) and period of free precession (=4 ms) were equivalent to those of the slSSFP simulations.

MRI

Five phantoms were prepared in 15 mL conical tubes of distilled water and 0.01, 0.03, 0.05, 0.07, and 0.09 mM $MnCl_2$ and spaced evenly in a single plastic container. The outer compartment contained doped tap water. T1 and T2 relaxation times were measured by conventional inversion recovery-prepared fast spin echo (TI=50-3200 ms, TR=10 s) and multicontrast spin echo (TE=25-250 ms, TR=10 s) methods and were approximately T2/T1=921/2279, 448/1702, 289/142, 194/1154, and 154/1009 ms. For both brain (7 T) and knee studies (1.5 T), a single healthy female volunteer (age 22) was used in accordance with conventional MRI protocols.

The exemplary pulse sequence of FIG. 2 was designed in the SequenceTree pulse programming environment (Laboratory of Structural NMR Imaging; University of Pennsylvania, Philadelphia, Pa.) and compiled in IDEA (Siemens Medical Solutions USA, Inc.; Malvern, Pa.). Images were acquired on 1.5 T or 7 T MRI systems (Siemens) equipped with 40 mT/m gradients and either a circularly polarized extremity coil (1.5 T; Siemens) or an 8-channel transmit and receive RF coil (7 T; Rapid Biomedical GmbH; Rimpar, Germany). When acquired concurrently, in all cases bSSFP and slSSFP scans were identical (with respect to bandwidth, pulse duration, FOV, etc.) with the exception of phase and frequency modulation of the transmitter and receiver.

Phantom images were acquired at 1.5 T using FOV=150 $mm^2$, TE/TR=3.1/6.2 ms, bandwidth=500 Hz/pixel, matrix=128×128×40, TSL=400 µs, slice thickness=5 mm. The flip angle or effective field angle was adjusted.

Human knee images were acquired at 1.5 T using FOV=150 $mm^2$, TE/TR=3.1/6.2 ms, bandwidth=500 Hz/pixel, matrix=128×128×64, TSL=200 µs, slice thickness=5 mm, α=20 or 40°. The RF pulse power was adjusted from 63 Hz (10 dB)-893 (33 dB) Hz in single dB increments, where the power in dB was measured with respect to a 20 Hz pulse.

Coronal slSSFP human brain images were acquired at 7 T at 0.469 $mm^2$ resolution using FOV=240×165 $mm^2$, TE/TR=3.6/7.2 ms, bandwidth=510 Hz/pixel, matrix=512×392×256, slice thickness=0.7 mm, TSL=400 µs, $\omega_1/2\pi$=80 Hz.

Steady-State Frequency Response

The steady-state sequences were modified to measure the frequency response ($\alpha_{bSSFP}$=20°, $B_0$=1.5 T, $v_{eff}$=5500 Hz). A small gradient in the phase encoding direction was pulsed briefly each TR ($G_{phase}$=0.6 mT/m). The gradient had the effect of generating a spatially dependent phase along the phase encoding direction such that $$\frac{\varphi}{TR} = \gamma G_{phase} xt \quad [13]$$

The experiments were performed in a homogeneous, spherical water phantom having relaxation times T1/T2=300/100 ms.

Data Analysis

Circular regions-of-interest (ROIs) were drawn manually in phantoms and in the medial patellar cartilage compartment, plantaris muscle and synovium of the knee joint from which the signal was measured; noise measurements were made from an ROI containing no tissue signal. Signal variation in slSSFP scans was measured by least-squares estimation of the percent change in signal with power (ΔS(%)/ΔdB). The reference amplitude from which the RF power (in dB) was measured was 20 Hz.

7 T brain images were resliced along axial and sagittal orientations and interpolated along the slice direction to match the in-plane resolution (0.469 mm), followed by correction for $B_1$ heterogeneity which was performed using a Gaussian low pass filter algorithm using a custom-written program in Matlab. In brief, low frequency component images (the filter) were obtained by windowing the spatial frequency domain with a two-dimensional Gaussian, and, subsequently, images at full resolution were multiplied by the filter inverse to obtain an image without spatial heterogeneity owing to the low frequency variation in the B1 field.

Magnetization Trajectory

The magnetization trajectory during the first 100 RF pulses is shown in FIG. 3. FIG. 3 illustrates longitudinal (A,E) and transverse (B,C,F,G) components and magnetization trajectory (D,H) during slSSFP (right) and bSSFP (left). The simulation depicts a magnetization trajectory in a frame of reference rotating at the Larmor frequency and so the magnetization rotates in the transverse plane during spin lock (F,G) as shown by oscillating x and y transverse components. As illustrated, the bSSFP flip angle α is twice the slSSFP angle of effective field orientation.

In FIG. 3, the inset to each curve is the response to the first 10 RF pulses. As expected, for bSSFP, the longitudinal (FIG. 3A) and transverse (FIG. 3B) components of the magnetization approach a steady-state condition, which is dependent on T1, T2, TR and α. During each RF pulse, the magnetization is flipped through the z-axis due to phase-alternation, so that briefly during the pulse the component of the magnetization in the transverse plane is zero. The trajectory of the magnetization vector can be shown to oscillate between ±α due to phase alternation (FIG. 3C) as has been described in the art. No component of the magnetization is parallel to the x-axis, which always holds true for RF delivered on-resonance.

Figure 3A:
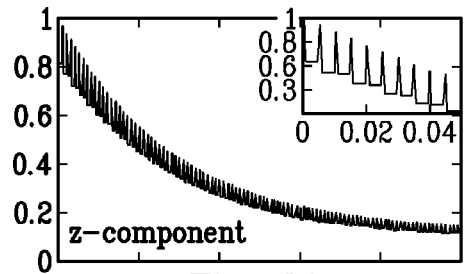
FIG. 3 illustrates the magnetization trajectory during the first 100 RF pulses designed using the techniques of the invention.
Figure 3E:
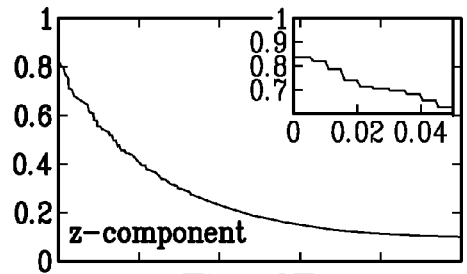
Figure 3B:
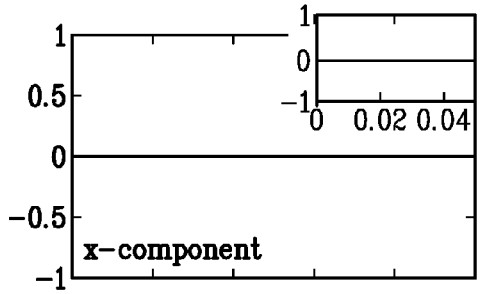
Figure 3F:
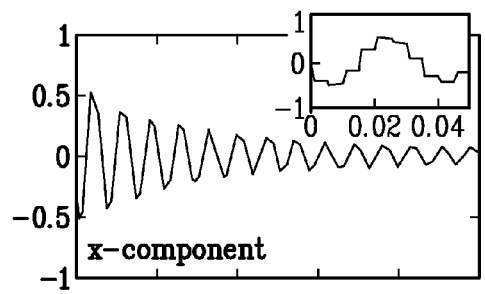
Figure 3C:
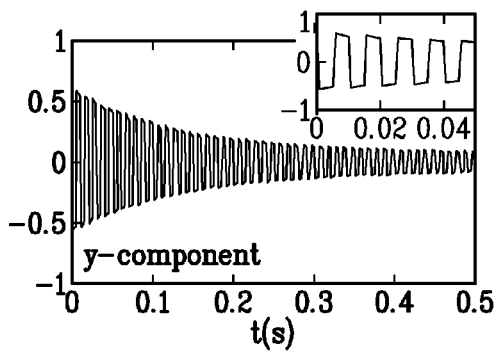
Figure 3G:
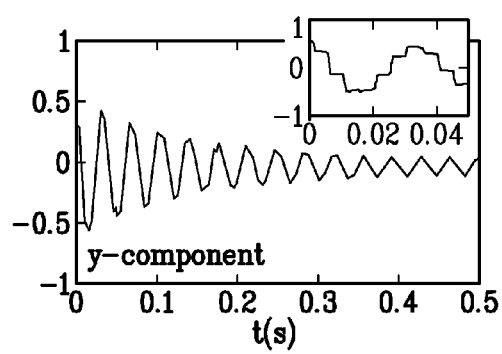
Figure 3D:
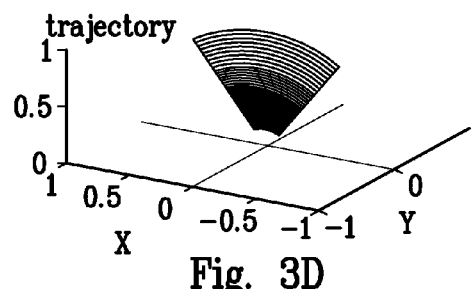
Figure 3H:
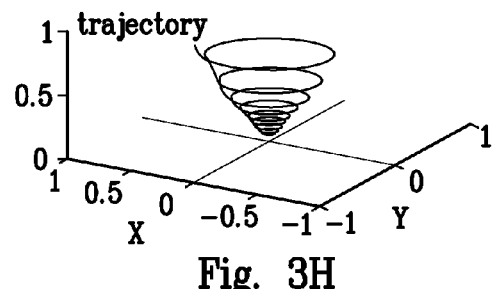

During slSSFP, on the other hand, the longitudinal magnetization decreases monotonically to the steady-state after the initial preparatory α pulse (FIG. 3D). Similarly, the transverse magnetization decays monotonically to the steady state (FIG. 3E). In contrast to the magnetization trajectory in FIGS. 3A and 3B, the trajectory is smooth, since the magnetization is never flipped. In fact, it can be shown that in the absence of relaxation, the magnetization has fixed longitudinal magnetization for all time. As illustrated in FIGS. 3F and 3G, the trajectory of the magnetization is very different from bSSFP. Although the magnetization is initially aligned at an angle α in the y-z plane, the magnetization traces a cone of angle α during RF irradiation (FIG. 3H).

Dependence on Relaxation Times

Figure 4:
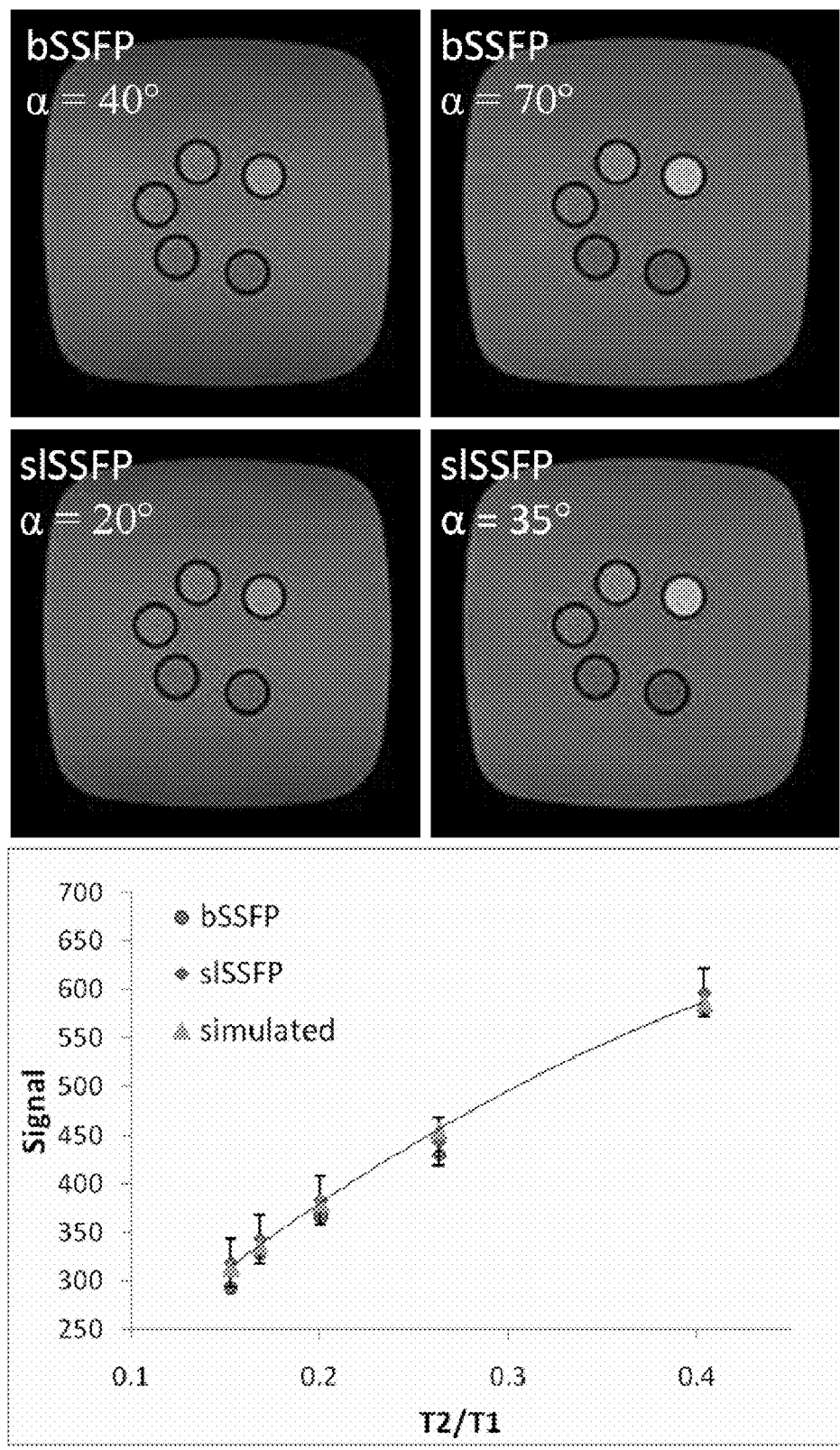
FIG. 4 illustrates that the values of T1 and T2 of the imaged phantom were identical to within 8% of for a wide range of T2/T1.

To determine the steady-state signal dependence on the relaxation times T1 and T2, the 5 $MnCl_2$ phantoms (0.01-0.09 mM) were scanned at two angles $\alpha_{bSSFP}$=40 and 70°. Separately, the T1 and T2 of the phantoms were each measured and the signal was plotted against the ratio T2/T1 for 70°. It was found that the signal was identical to within 8% of for a wide range of T2/T1 (FIG. 4) and the signal at 40° was measured to have a similar dependence. The images of FIG. 4 depict signal contrast in 5 MnCl2 phantoms for both bSSFP (top) and slSSFP (middle) scans at a flip angle of 40° (effective field angle 2α=40°) and 70° (35°). A plot of the experimental and simulated signal dependence on the relaxation times T2/T1 during each scan is shown at the bottom. The simulated curve of FIG. 4 was generated by a curve fitting routine using a flip angle of 70° and the measured T1 and T2 using the steady-state equation for phase-alternated bSSFP as described by Scheffler et al. in "T-1 Quantification with inversion recovery TrueFISP," Magn. Reson. Med. 2001, 45(4): 720-723.

Dependence on RF Pulse Power and Effective Field Angle

Figure 5:
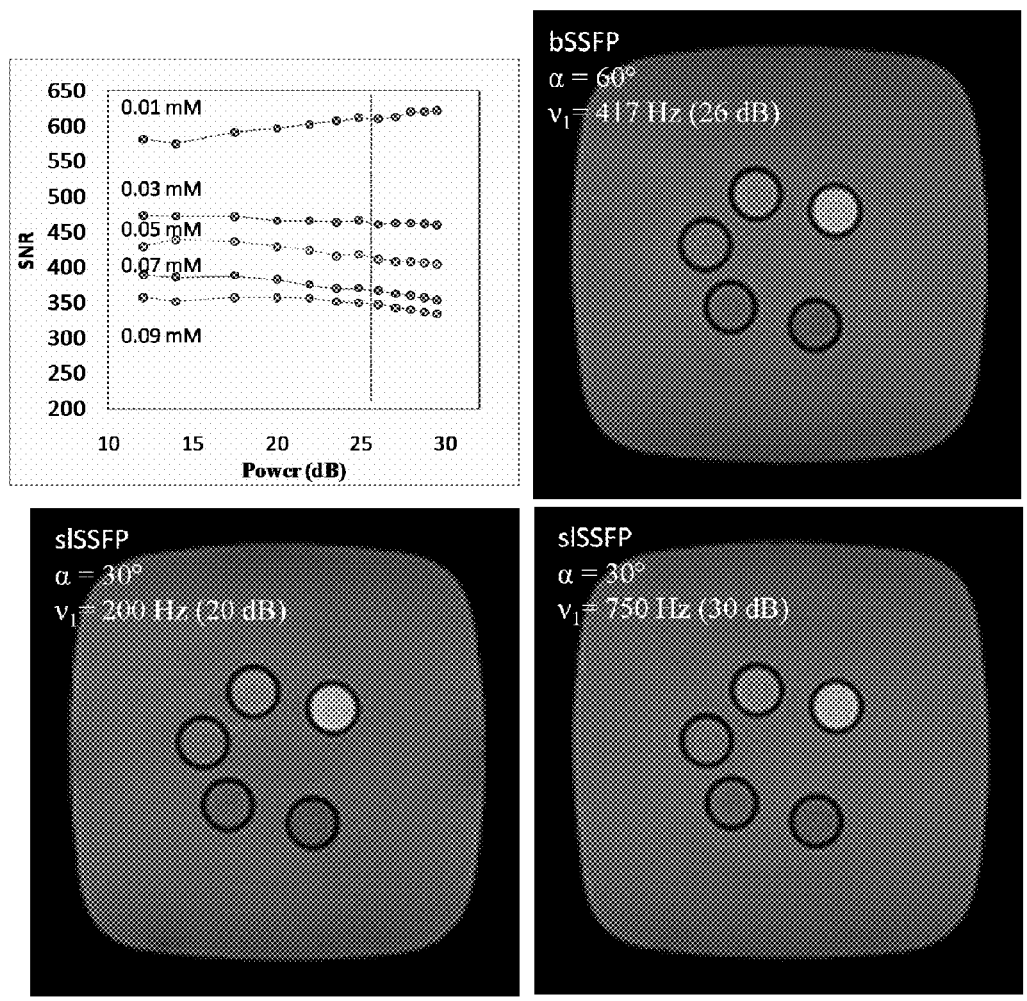
FIG. 5 illustrates that the SNR from each of the 5 $MnCl_2$ samples was found to vary less than 1% per dB of RF pulse power over a wide range of pulse power 10-30 dB ($v_1$=71-710 Hz).

The Bloch equations predict that the steady-state signal should be independent of $\omega_1$ if Eq. [5] is satisfied and $\Delta\omega$ is adjusted to maintain the orientation of the effective field. Several experiments have been performed to validate the independence of the steady-state signal in response to RF pulse power adjustment. FIG. 5 illustrates that the slSSFP signal was independent from the delivered pulse power in 5 $MnCl_2$ doped phantoms. The dashed vertical line depicts the bSSFP power which was required to maintain the steady-state with $\alpha_{bSSFP}=60°$. As the two lower images demonstrate, it is possible to vary the slSSFP pulse power over a wide range without a significant change in SNR. In particular, as illustrated in FIG. 5, the SNR from each of the 5 $MnCl_2$ samples was found to vary less than 1% per dB of RF pulse power over a wide range of pulse power 10-30 dB ($v_1$=71-710 Hz). The percent change in signal for each of the phantoms was 0.47 (0.01 mM), 0.17 (0.03 mM), 0.47 (0.01 mM), 0.56 (0.07 mM) and 0.34 (0.09 mM) %/dB. For reference, the amplitude of an identical RF pulse used during bSSFP that would achieve the same signal is drawn as the vertical line illustrating that a spin locked steady-state could be maintained with nearly 14 dB lower power and a 24-fold reduction in SAR under these conditions.

In the experimental configuration, it was important to shim well, since RF pulse power much less than 15 dB (112 Hz) suffered signal nonuniformity owing to variations in the static field. It was observed that for low angles this restriction was less critical because, for the same $\omega_1$, an increased $\Delta\omega$ was necessary to properly orient the effective field and, consequently, the increased $\omega_{eff}$ could adequately overcome static field variations.

Figure 6:
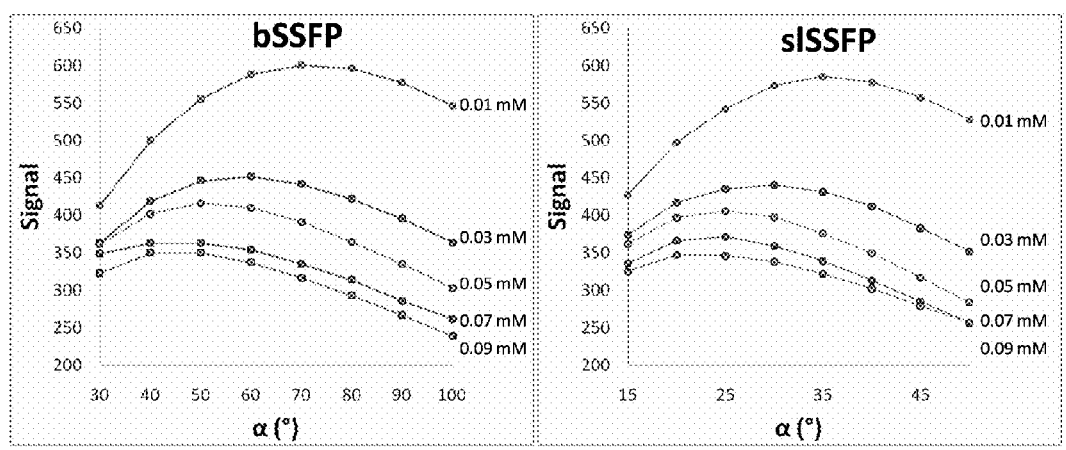
FIG. 6 illustrates the findings that an effective field orientation-dependent signal for slSSFP was identical to a flip angle-dependent bSSFP signal but for one half the angle.

The inventors also determined that it was still possible to modulate the slSSFP signal by rotating the direction of the effective field. In this way, it was possible to mimic the well-known bSSFP flip angle signal dependence. This was found experimentally in $MnCl_2$ samples, which demonstrated an effective field orientation-dependent signal that was identical to flip angle-dependent bSSFP signal (FIG. 6), but for one half the angle. In FIG. 6, the experimentally determined slSSFP signal dependence (right) is shown to be nearly identical to bSSFP signal dependence (left) in 5 $MnCl_2$ doped phantoms and could be adjusted by modulation of the effective field orientation and preparatory flip angle. The phase alternated bSSFP flip angle was maximized in the limit TR<<T2<T1

$$\cos\alpha = \frac{\frac{T1}{T2} - 1}{\frac{T1}{T2} + 1} \quad [14]$$

which for each sample was calculated to be 64.9, 54.3, 48.2, 44.6 and 42.7°. This was in agreement with both the observed bSSFP maximum and the slSSFP maximum, but with an effective field oriented at half the angle.

Figure 7:
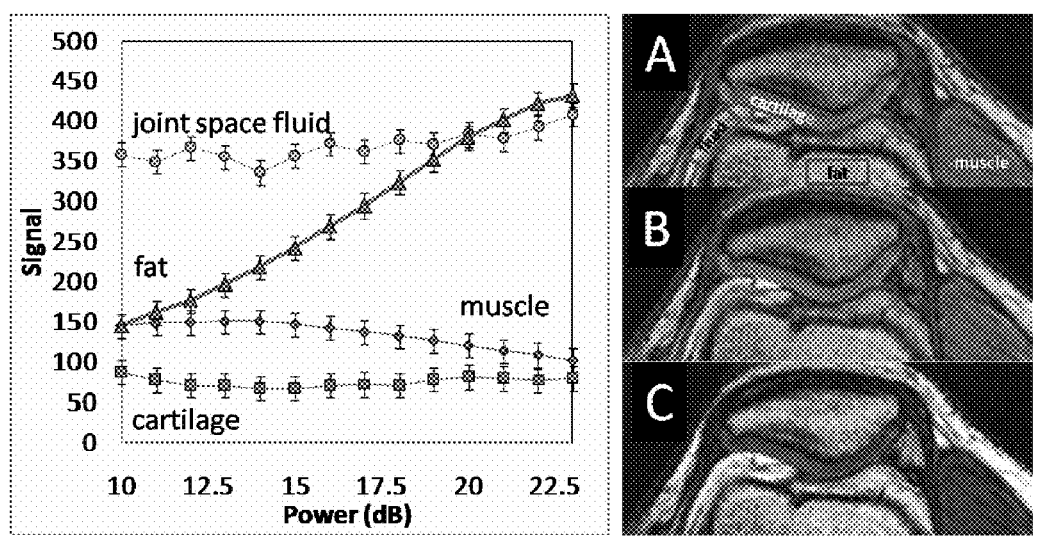
FIG. 7 illustrates representative axial knee images demonstrating an 11.5 dB reduction in power with only very small change in signal and contrast from A (12 dB, 80 Hz) and B (23.5 dB, 300 Hz).

To further test the signal independence, in vivo knee imaging was performed and the signal from joint space fluid, muscle and cartilage signal was determined also to be relatively independent of pulse power (FIG. 7), although the effects of low frequency relaxation dispersion were not analyzed. FIG. 7 illustrates that the slSSFP signal is relatively independent of pulse power in knee joint space fluid, muscle and cartilage as shown by the graph on the left. To further illustrate, two slSSFP axial knee images shown were acquired with (FIG. 7A) 12 dB (80 Hz), $\alpha=20°$ and (FIG. 7B) 23.5 dB (300 Hz), $\alpha=20°$ demonstrating how RF pulse power can be lowered in such as a way to reduce SAR, but without changing in contrast. On the other hand, it is possible to change contrast by rotating the orientation of the effective field (FIG. 7C) 23.5 dB (300 Hz), $\alpha=40°$.

The representative axial knee images of FIG. 7 demonstrate an 11.5 dB reduction in power with only very small change in signal and contrast from FIG. 7A (12 dB, 80 Hz) and FIG. 7B (23.5 dB, 300 Hz). Tissues for which the slSSFP pulse and receiver phase was not properly matched, such as fat, could exhibit contrast variation with $\omega_1$. The contrast-to-noise ratio (CNR) was measured for joint space fluid, muscle and cartilage as 20 (JSF/M), 25 (JSF/C) and 5 (M/C).

slSSFP at Ultra High Field

Figure 8:
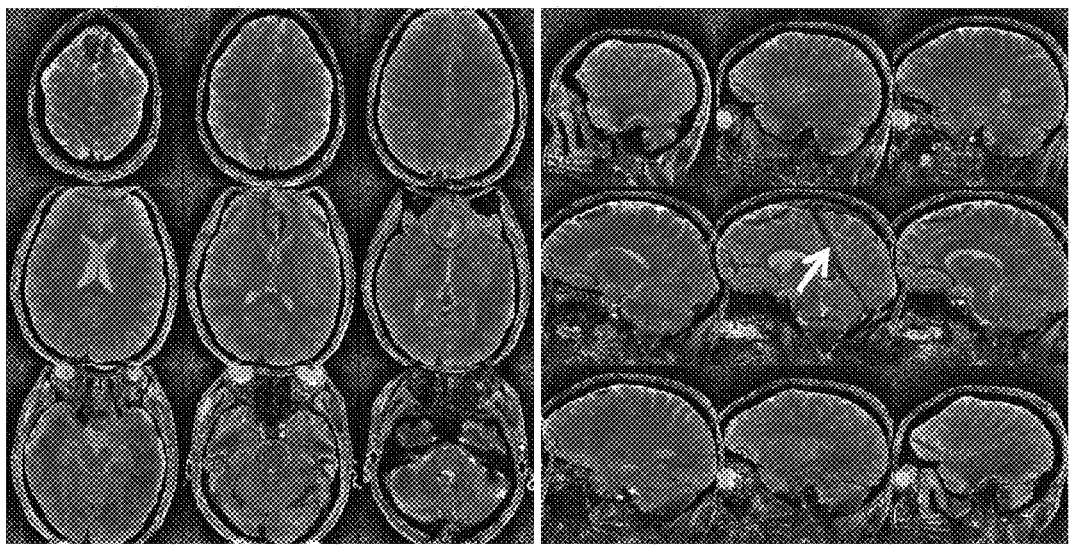
FIG. 8 illustrates brain scans performed at 7 T will full volume coverage used to measure the potential contrast-to-noise (CNR) ratio among brain tissues at ultra high field using slSSFP.

To measure the potential contrast-to-noise (CNR) ratio among brain tissues at ultra high field using slSSFP, brain scans were performed at 7 T with full volume coverage as shown in FIG. 8. In the images of FIG. 8, full brain coverage (0.47 $mm^2$×0.7 mm) with T2-weighting was achieved using fast slSSFP imaging at ultra high field (7 T) for which a similar bSSFP scan was not possible because the delivered SAR exceeded mandated limits. The white arrow depicts steady-state artifacts owing to static field variation and the halo surrounding the brain is an artifact of post-processing $B_1$ heterogeneity correction. In the images of FIG. 8, T2-weighted contrast was maximized empirically ($\alpha_{bSSFP}=15°$) and grey matter, white matter and CSF CNR was measured to be 9.4 (GM/WM), 24.6 (GM/CSF) and 34.0 (WM/CSF). The reduction in power achieved with slSSFP that enabled scanning was 2.3 dB. This pulse power reduction corresponded to a pulse amplitude reduction from $\omega_1/2\pi$=104 Hz (bSSFP) to 80 Hz (slSSFP). Although the pulse power was relatively low for slSSFP, it should be reiterated that for low effective field orientations, the effective field amplitude $\omega_{eff}$=612 Hz could adequately overcome variations in the static field to reduce artifacts.

Figure 9:
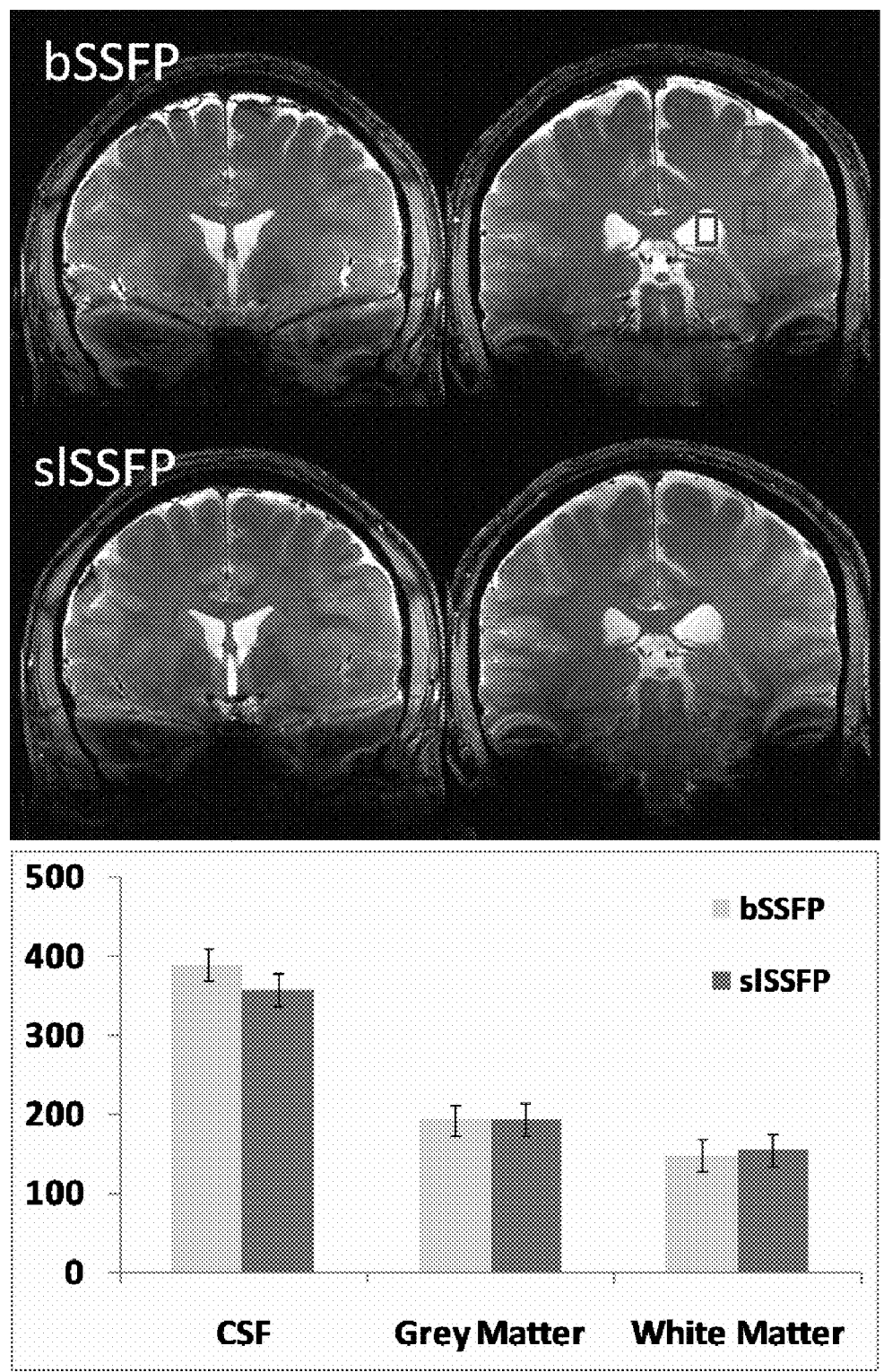
FIG. 9 illustrates result of two scans with increased pulse duration (800 μs) to accommodate the bSSFP flip angle and illustrates the similarity in contrast and SNR efficiency with bSSFP.

FIG. 9 demonstrates the result of two scans with increased pulse duration (800 μs) to accommodate the bSSFP flip angle and illustrates the similarity in contrast and SNR efficiency. FIG. 9 illustrates a comparison of 7 T bSSFP (top) and slSSFP (middle) scans with identical sequence parameters, but with a pulse duration twice that which was used in FIG. 8 to enable scanning within SAR limitations. The chart on the bottom of FIG. 9 shows the SNR characteristics of both pulse sequences in the CSF, grey matter, and white matter in three ROI drawn as depicted in the upper-right image.

Steady-State Frequency Response

Figure 10:
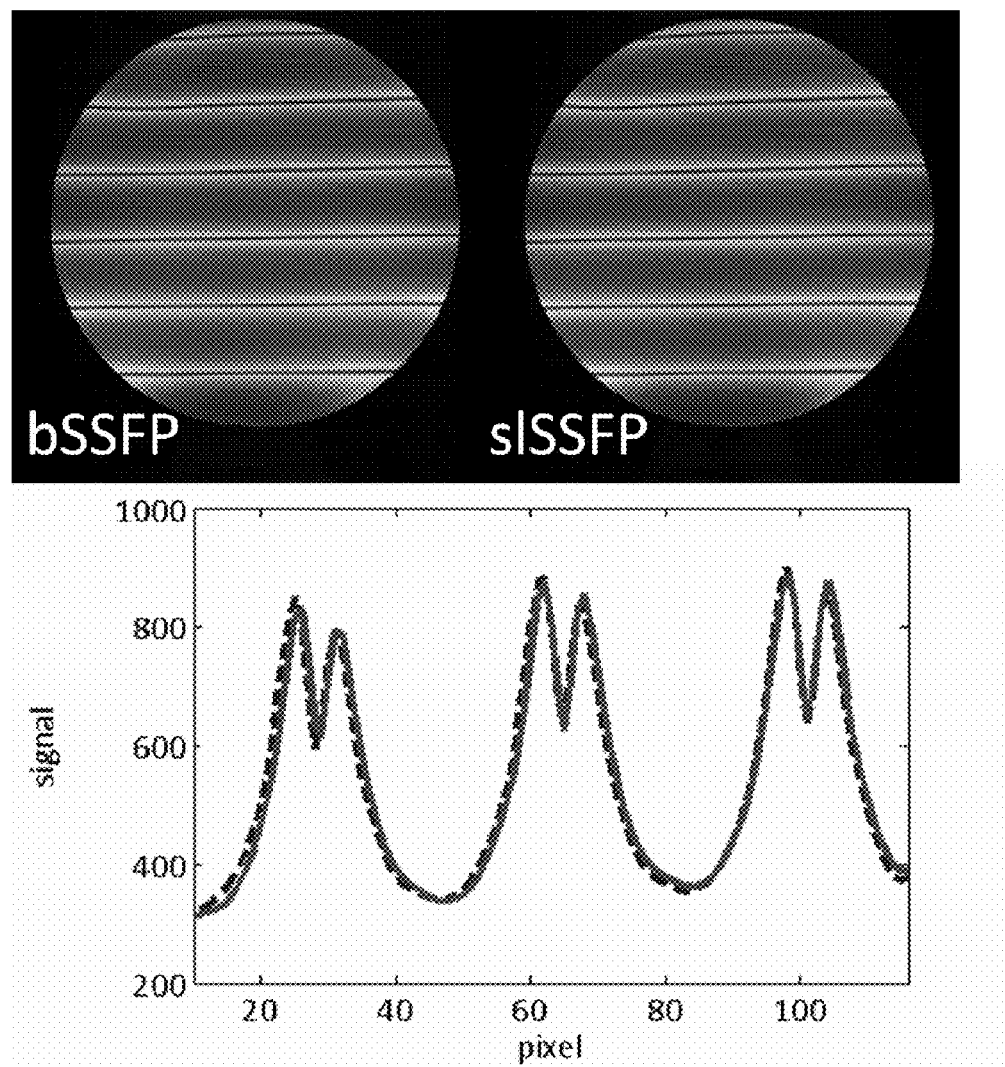

One of the key features of the bSSFP sequence is the frequency response profile and its characteristic signal voids that repeat whenever the phase accumulation during a single TR is π radians. By applying a gradient pulse along the phase encoding direction briefly each TR, one can produce a spatially-dependent frequency response profile along the gradient axis. In this way, the band separation is related to the gradient moment rather than the frequency shift from resonance. FIG. 10 illustrates the spatially-dependent frequency response of bSSFP (upper left image, dotted curve in graph) and slSSFP (upper right image solid curve in graph). These images were obtained by briefly applying a gradient pulse each TR to generate a small, but nonzero, gradient moment. In particular, FIG. 10 depicts a single slice from two consecutive acquisitions of bSSFP and slSSFP in which both the band separation and signal amplitude is similar. At low $\omega_1$ there was an $\omega_1$ dependent and may explain the change in the fat steady-state signal observed in the knee. The shift in the spectral response was small and did not significantly affect tissues that were properly locked along the effective field.

Explanation of Experimental Results

The experimentation described above effectively demonstrated that slSSFP scanning can be performed over a range of RF pulse power without modifying the steady-state signal. At high (3 T) and ultra high (7 T+) fields this is important since the RF pulse amplitude can be adjusted to satisfy SAR constraints presumably without affecting image contrast. This result seems counterintuitive since most spin locking applications are SAR intensive, requiring both high power and long duration irradiation. However, the above described experiments using the pulse sequence of the invention has shown experimentally that for liquid samples under extreme motional narrowing, the RF power can be reduced without significantly changing the contrast.

The numerical treatment of slSSFP presented above is valid for a single spin population in motionally narrowed systems, but the magnetization response is certainly much more complex in vivo. However, the use of the Bloch equations to compare bSSFP and slSSFP is justified since the inventors are not currently aware of any rotating frame relaxation analysis of bSSFP in imaging, although effects such as rotating frame relaxation on image contrast are likely present.

The effects of off-resonance spin locking RF irradiation on image contrast have been previously examined by several authors including Moran et al., "Near-Resonance Spin-Lock Contrast," Magn. Reson. Imag., 1995; 13(6): 837-846; Ulmer et al., "Magnetization transfer or spin-lock? An investigation of off-resonance saturation pulse imaging with varying frequency offsets," Am. J. Neuroradiol., 1996; 17(5): 805-819; and Grohn et al., "On- and off-resonance T-1 rho MRI in acute cerebral ischemia of the rat," Magn. Reson. Med. 2003; 49(1): 172-176. All authors seem to agree that with fixed RF amplitude $\omega_1$, there is a tradeoff between T1 and T1$\rho$ contrast which depends on $\Delta\omega$. The inventors suspect that a similar tradeoff exists for steady-state off-resonance T1$\rho$ contrast, but this relations remains to be explored.

Figure 11:
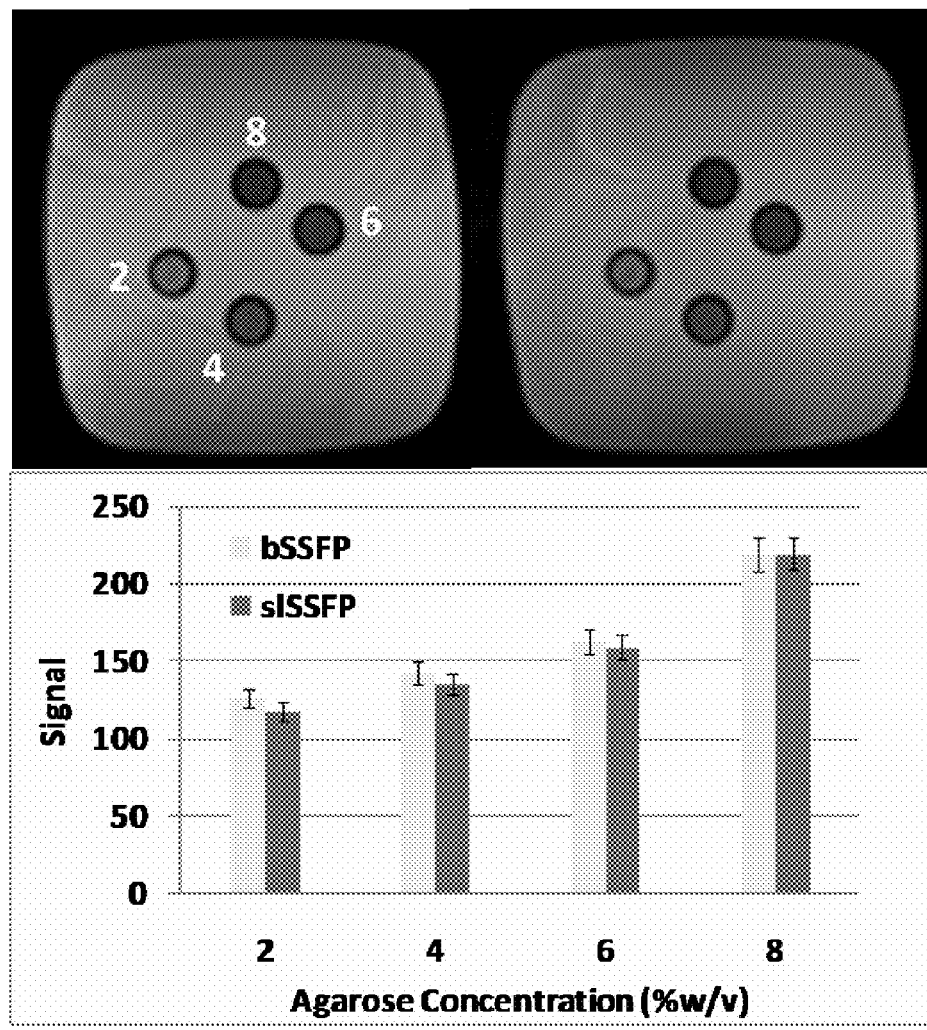
FIG. 11 illustrates that the difference in contrast for imaging of agarose phantoms of varying agarose concentrations for slSSFP is not very much different from bSSFP.

The delivery of RF irradiation generates a magnetization transfer effect that may alter the steady-state signal from that which is described in the foregoing theory. Previous investigations of SSFP sequences have shown that there is an intrinsic magnetization transfer effect that affects the signal contrast. It seems that the difference in contrast as a result of off-resonance irradiation in slSSFP is not very much different from bSSFP in a clinical situation as FIGS. 7, 8 and 9 illustrate. As illustrated in FIG. 11, similar observations were found for agarose phantoms of varying agarose concentrations. For all practical purposes, the dominant contrast mechanisms are the relaxation times and the orientation of the effective field. This may be because the primary magnetization transfer contrast in the tissues observed is that between a free water pool and a bound water pool whose broad line extends across the frequencies irradiated in the experiments. A thorough study of magnetization transfer will require an analysis of signal on the separate, complex dependencies of the frequency of RF irradiation, the exchange rate, the number of spin pools undergoing exchange, the size of the spin pools and several other considerations. In addition, untying the magnetization transfer effect from a possible T1$\rho$ dispersion effect remains since both depend on $\omega_1$.

Phase alternated bSSFP and slSSFP have many features in common and, at the same time, have many important differences. In the implementation here, both bSSFP and slSSFP consist of a series of rectangular pulses interleaved with a short acquisition period and balanced imaging gradients. The duration of the rectangular pulses for both bSSFP and slSSFP was identical. Both sequences used 3D phase encoding with identical kspace trajectories. Both sequences were prepared with an $\alpha/2$ pulse. However, the primary difference between the two sequences was that for bSSFP the RF pulse was delivered on-resonance and with a phase perpendicular to the magnetization, while for slSSFP the RF field was delivered off-resonance and with a phase parallel to the magnetization. Despite these differences, and despite neglecting an off-resonance rotating frame analysis, the magnetization response is nearly identical but with significantly lower power requirements.

slSSFP is generally limited to nonselective excitation and this may reduce the utility of the technique for MR applications that require slice selection. To apply a gradient simultaneously with the off-resonance spin locking pulse would dephase spin isochromats to change resonance and thus would be no longer locked parallel to the effective field. These challenges are similar to those encountered when designing slice selective adiabatic pulses. For some applications, it is possible to overcome these limitations by using local transmit or receive coils or simply encoding the entire field of view. The latter may not be too constraining because of the very high acquisition rate of SSFP sequences together with very short RF pulse durations and partial or parallel acquisition techniques to reduce the number of gradient encodings.

On the other hand, adiabatic pulses may replace the continuous wave (cw) spin locking pulses used in the exemplary embodiment. Radiofrequency (RF) pulses that are delivered parallel to the magnetization may be used to adjust the orientation of the magnetization through an adiabatic sweep. In this way, it is possible to interleave acquisition with a RF pulse train containing either adiabatic, continuous wave, or both types of pulses.

The sensitivity of slSSFP to field heterogeneity ($B_0$ and $B_1$) is different from bSSFP. If the RF field is not homogeneous, then the magnetization is not uniformly flipped along the effective field. Subsequently, during the spin locking pulse, the magnetization nutates around the effective field and the transient decay to the steady-state is different. Previous efforts to reduce spin lock nutations have been successful using rotary echo or adiabatic techniques and it is believed that these techniques will be similarly useful with the techniques described herein. On the other hand, any free precession that occurs due to static field heterogeneity will cause the magnetization to enter a different steady-state as well. Like bSSFP, it is expected that there will be a spectral response that depends on the accumulated phase per TR. However, if the amplitude of the spin locking pulse is sufficient ($\omega_1 \gg \Delta\omega_0$), then it may be possible to achieve very long TRs (by increasing the duration of the RF pulse and not the free precession period) with artifacts comparable to a much shorter TR bSSFP. Also, integrated spin echo and spin lock experiments could eliminate artifacts completely, but with a SAR penalty. It is unclear whether rotating frame relaxation or field heterogeneity accounts for differences in contrast between bSSFP and slSSFP in FIGS. 7 and 8, although certainly the effects of field heterogeneity are clearly visible. The frequency response shifted with $\omega_1$ for the same effective field orientation and this might explain the change in the fat steady-state. It is suspected that the frequency-dependent response is related to the effective field orientation, spin lock amplitude, $\Delta\omega$ and the relaxation times. The change in the steady-state signal was apparently small for tissues that were properly locked.

Those skilled in the art appreciate that all magnetization prepared sequences require a contrast induction period (magnetization preparation) followed by an imaging sequence and a considerable delay period to restore equilibrium magnetization. The spin locked steady state generated by the slSSFP pulse sequence of the invention obviates the need for separate magnetization preparation and imaging components, eliminating the long delay, and therefore may reduce the scan time considerably. Those skilled in the art will appreciate that the techniques of the invention can be used as a substitute for magnetization preparation techniques such as T1 rho-prepared imaging, T1 rho-off-resonance prepared imaging, and magnetization transfer imaging and its derivatives, including semisolid pool saturation and exchange, nuclear Overhauser effect, CEST imaging, and polarization transfer techniques.

Those skilled in the art will further appreciate that with the appropriate choice of frequency and phase of the RF pulse and receiver, the spin locked steady state signal is fat suppressed. Fat suppression in many cases is desirable and is a featured component on clinical scanners for imaging the knee, brain, and other tissues. Conversely, with a similarly appropriate choice of frequency and phase of the RF pulse and receiver, the spin locked steady state signal is water suppressed. In many cases, water suppression is also desirable and is a featured component in clinical scanners. In consideration of these options, any appropriate choice of frequency and phase of the RF pulse and receiver may be selected to enhance or diminish the signal from any nuclei with a spectral shift from the slSSFP desired frequency. The bSSFP signal requires disruption of the steady state in order to spectrally suppress tissues, whereas the slSSFP signal requires no disruption of the steady state. The bSSFP sequence requires an appropriate RF pulse flip angle to maximize the SNR. In many cases, the required flip angle is 50-70° and can deposit considerable RF energy into tissues causing undesirable and unsafe heating. As noted above, it is possible to accomplish similar contrast in the same time using significantly less RF power using the slSSFP sequence described herein. Moreover, as also noted above, the slSSFP sequence is very advantageous for ultra high field MRI. Also, the slSSFP sequence has a very different frequency response than bSSFP and may be used to reduce off-resonance artifacts.

Those skilled in the art will also appreciate that the invention may be applied to other applications and may be modified without departing from the scope of the invention. For example, the radiofrequency pulses described herein are those used for a nuclear magnetic resonance spectroscopy or imaging experiment. The slSSFP sequence may be used as an imaging technique for diagnosis of many diseases including, for example, Alzheimer's disease, osteoarthritis, multiple sclerosis, atherosclerosis, and cancer. The slSSFP sequence may also be used as an imaging tool for viewing the biomechanics and/or biochemistry of tissues and the progression of disease, tissue repair, or the effects of pharmaceutical agents on the tissues. Generally, the radiofrequency pulses described herein may have any frequency and may be used for other applications such as electron paramagnetic resonance. Accordingly, the scope of the invention is not intended to be limited to the exemplary embodiments described above, but only by the appended claims.

What is claimed:

1. A device configured for creating a magnetic resonance image of a sample, comprising:
   a magnet that applies a magnetization to the sample to be imaged;
   a processor programmed to generate a pulse sequence comprising a series of one or more off-resonance spin locked pulses and/or adiabatic pulses of finite duration that are applied at a phase in parallel to the applied magnetization and imaging gradients being interleaved with the one or more off-resonance spin locked pulses and/or adiabatic pulses in the series for frequency and phase encoding;
   a pulse generator responsive to said pulse sequence to generate radiofrequency fields that perturb the magnetization about the sample; and
   an image acquisition device that acquires a magnetic resonance image of the sample from said imaging gradients.

2. The device of claim 1, wherein the spin locked pulses are applied in a transient period of the magnetization.

3. The device of claim 1, wherein the spin locked pulses are spin locked steady state free precession pulses (slSSFP).

4. The device of claim 3, wherein the phase of the pulse generator and image acquisition device is incremented between slSSFP pulses by $\Delta\omega t$, where $\Delta\omega$ is an amount the phase of the off resonance slSSFP pulses differ from the Larmor precession frequency and t is the duration of the period between each slSSFP pulse.

5. The device of claim 4, wherein when operating in a frame of reference at the Larmor frequency, the magnetization rotates at a constant frequency $\Delta\omega$ around a Z-axis during irradiation of the sample by the radiofrequency fields, rather than during a free precession period.

6. The device of claim 5, wherein the pulse generator further applies an initial preparatory pulse having a flip angle $\alpha=\theta$ around the z-axis and an amplitude $\omega_1$ that is much greater than 1/T1 and 1/T2 whereby the magnetization remains fixed and does not rotate.

7. The device of claim 6, wherein the magnetization is in a steady state depending upon at least T1, T2, and $\Delta\omega$ and the pulse sequence is not dependent over a range of radiofrequency power used in imaging the sample on the power or flip angle of the slSSFP pulses or adiabatic pulses.

8. The device of claim 1, wherein the magnetization is generated by at least a 3 Tesla magnet.

9. A method for creating a magnetic resonance image of a sample, comprising:
   applying a magnetization to the sample to be imaged;
   generating, using a computer, a pulse sequence comprising a series of one or more off-resonance spin locked pulses and/or adiabatic pulses of finite duration that are applied at a phase in parallel to the applied magnetization and imaging gradients interleaved with the one or more off-resonance spin locked pulses and/or adiabatic pulses in the series for frequency and phase encoding;
   generating from said pulse sequence radiofrequency fields that perturb the magnetization about the sample; and
   acquiring a magnetic resonance image of the sample from said imaging gradients.

10. The method of claim 9, further comprising applying the spin locked pulses to the sample in a transient period of the magnetization.

11. The method of claim 9, wherein the spin locked pulses are spin locked steady state flee precession pulses (slSSFP).

12. The method of claim 11, further comprising incrementing the phase of a pulse transmitter that generates said radiofrequency fields and an image acquisition device that acquires said magnetic resonance image between slSSFP pulses by $\Delta\omega t$, where $\Delta\omega$ Is an amount the phase of the off resonance slSSFP pulses differ from the Larmor precession frequency and t is the duration of the period between each slSSFP pulse.

13. The method of claim 12, wherein when operating in a frame of reference at the Larmor frequency, rotating the magnetization magnetic field at a constant frequency $\Delta\omega$ around a z-axis during irradiation of the sample by the radiofrequency fields, rather than during a free precession period.

14. The method of claim 13, further comprising applying an initial preparatory pulse having a flip angle $\alpha=\theta$ Around the z-axis and an amplitude $\omega_1$ that is much greater than 1/T1 and I/T2 whereby the magnetization magnetic field remains fixed and does not rotate.

15. The method of claim 14, further comprising creating a steady state magnetic field magnetization depending upon at least T1, T2, and $\Delta\omega$, wherein the pulse sequence is not dependent over a range of radiofrequency power used in imaging the sample on the power or flip angle of the slSSFP pulses or adiabatic pulses.

16. The A non-transitory computer readable storage medium containing instructions stored therein that when read and processed by a processor cause said processor to implement a method for creating a magnetic resonance image of a sample, said instructions comprising instructions that cause said processor to:
   instruct a magnet to apply a magnetization to the sample to be imaged;
   generate a pulse sequence comprising a series of one or more off-resonance spin locked pulses and/or adiabatic pulses of finite duration that are applied at a phase in parallel to the applied magnetization and imaging gradients being interleaved with the one or more off-resonance spin locked and/or adiabatic pulses in the series for frequency and phase encoding;
   instruct a pulse generating device to generate from said pulse sequence radiofrequency fields that perturb the magnetization about the sample; and
   instruct an image acquisition device to acquire a magnetic resonance image of the sample from said imaging gradients.

17. The medium of claim 16, wherein the pulse generating device is instructed to apply said spin locked pulses in a transient period of the magnetization.

18. The medium of claim 16, wherein the spin locked pulses are spin locked steady state free precession pulses (slSSFP).

19. The medium of claim 18, further comprising instructions for causing said processor to increment the phase of said pulse generating device and said image acquisition device between slSSFP pulses by $\Delta\omega t$, where $\Delta\omega$ ls an amount the phase of the off resonance slSSFP pulses differ from the Larmor precession frequency and t is the duration of the period between each slSSFP pulse.

20. The medium of claim 19, wherein if when operating in a frame of reference at the Larmor frequency, the processor causes said magnet to rotate the magnetization at a constant frequency $\Delta w$ around a z-axis during irradiation of the sample by the radiofrequency fields, rather than during a free precession period.

21. The medium of claim 20, further comprising instructions for causing said processor to instruct said pulse generating device to apply an initial preparatory pulse having a flip angle $\alpha=\theta$ Around the z-axis and an amplitude $\omega_1$ that is much greater than 1/T1 and I/T2 whereby the magnetization remains fixed and does not rotate.

22. The medium of claim 21, further comprising instructions that cause said processor to control said magnet to create a steady state magnetization depending upon at least T1, T2, and $\Delta\omega$, wherein the pulse sequence is not dependent over a range of radiofrequency power used in imaging the sample on the power or flip angle of the slSSFP pulses or adiabatic pulses.

* * * * *